United States Patent [19]

Pettingell et al.

[11] Patent Number: 4,956,923
[45] Date of Patent: Sep. 18, 1990

[54] PROBE ASSEMBLY INCLUDING TOUCHDOWN SENSOR

[75] Inventors: James T. Pettingell, Escondido, Calif.; Kenneth F. Hollman, Carson City, Nev.

[73] Assignee: The Micromanipulator Co., Inc., Carson City, Nev.

[21] Appl. No.: 433,021

[22] Filed: Nov. 6, 1989

[51] Int. Cl.$^5$ .................. G01R 1/06; G01R 31/02; G01B 7/00
[52] U.S. Cl. .................. 33/558; 324/158 P; 33/561
[58] Field of Search .................. 33/556, 543, 558, 555, 33/558.4, 559, 533, 561, 572, 501.03, 501.04, 501.5, 501.6, 793, 645; 200/283, 335; 324/158 F, 158 P

[56] References Cited

U.S. PATENT DOCUMENTS

| | | |
|---|---|---|
| 2,011,931 | 8/1935 | Dreyer . |
| 2,417,148 | 3/1947 | Wright . |
| 2,707,333 | 5/1955 | Schaurte ........................... 33/501.6 |
| 3,076,069 | 1/1963 | DeCamillis et al. . |
| 3,171,012 | 2/1965 | Morehead . |
| 3,243,186 | 3/1966 | Johnson . |
| 3,258,571 | 6/1966 | Schmidt ........................... 200/283 |
| 3,488,461 | 1/1970 | Webb . |
| 3,551,807 | 12/1970 | Kulischenko ................... 324/158 P |
| 3,742,610 | 7/1973 | Calame . |
| 3,750,295 | 8/1973 | Nordmann ....................... 33/503 X |
| 3,849,614 | 11/1974 | Connery . |
| 4,123,706 | 10/1978 | Roch ............................... 324/158 F |
| 4,382,228 | 5/1983 | Evans ............................. 324/158 F |
| 4,523,063 | 6/1985 | Kroetsch . |
| 4,542,590 | 9/1985 | Cusack . |
| 4,553,332 | 11/1985 | Golinelli et al. . |
| 4,575,947 | 3/1986 | Stauber . |

Primary Examiner—Harry N. Haroian
Attorney, Agent, or Firm—Fitch, Even, Tabin & Flannery

[57] ABSTRACT

A probe assembly for use at a test station for contacting a target on an electrical circuitry component. The probe assembly includes an elongate tubular housing with a base of insulative material rigidly supported in the housing adjacent one end thereof. An interior beam assembly connects a contact block to the base with this beam assembly including a relatively flexible cantilever beam. A relatively rigid second beam assembly extends from the contact block beyond the other end of the housing and holds a probe point for contacting the target. The probe assembly also includes an upper contact held by the housing and extending into the housing cavity toward the contact block, and a lower contact held by the housing and extending into the cavity toward the contact block. The spacing between the upper and lower contacts is greater than the height of the contact block and the surfaces of the contact block facing the contacts are conductive. The contact block engages the lower contact when the probe does not engage the target, the block moves out of engagement with the lower contact after the probe point engages the target, and the block moves into contact with the upper contact when the force applied by the point against the target reaches a predetermined magnitude.

10 Claims, 3 Drawing Sheets

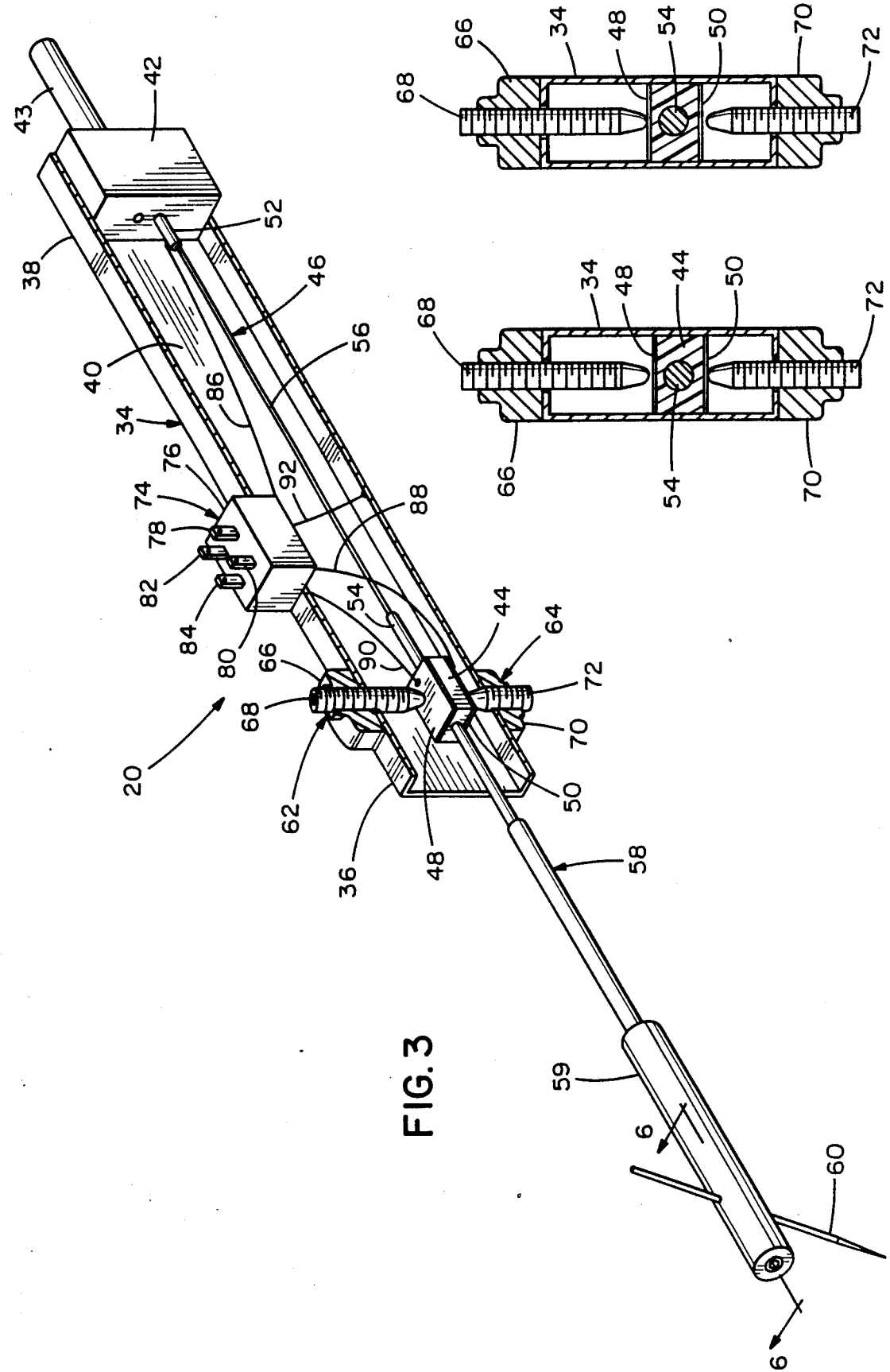

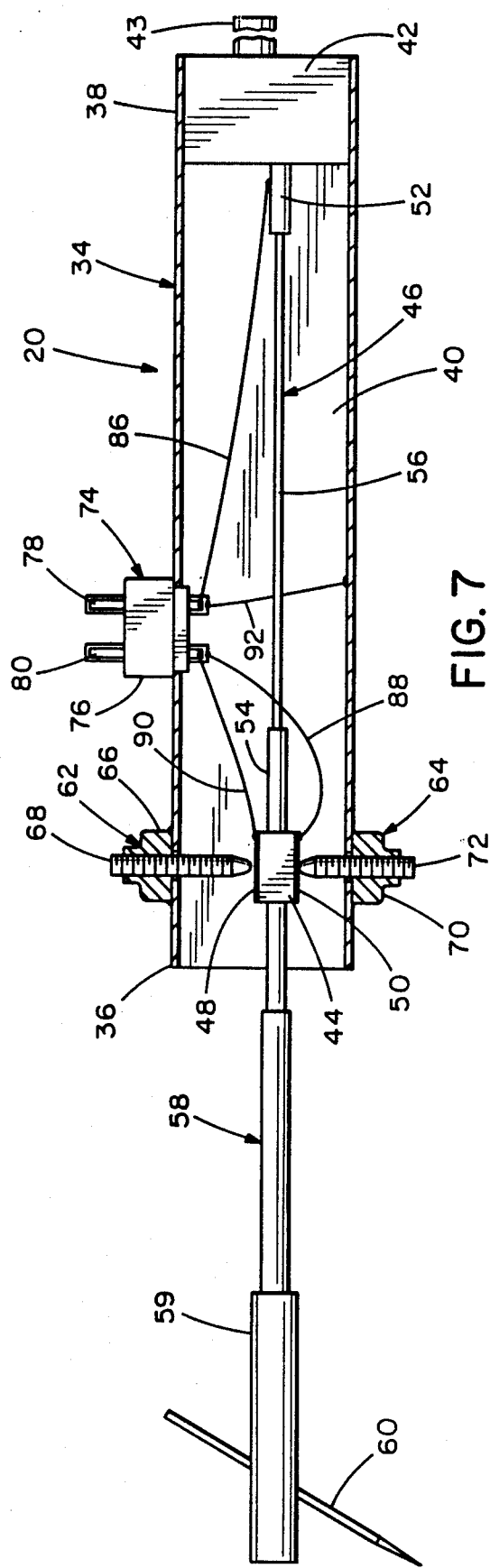
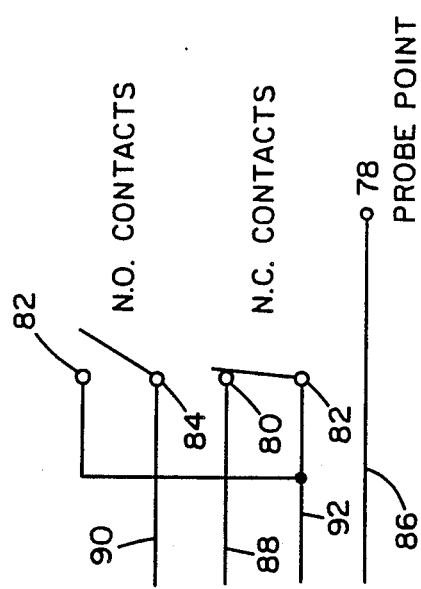
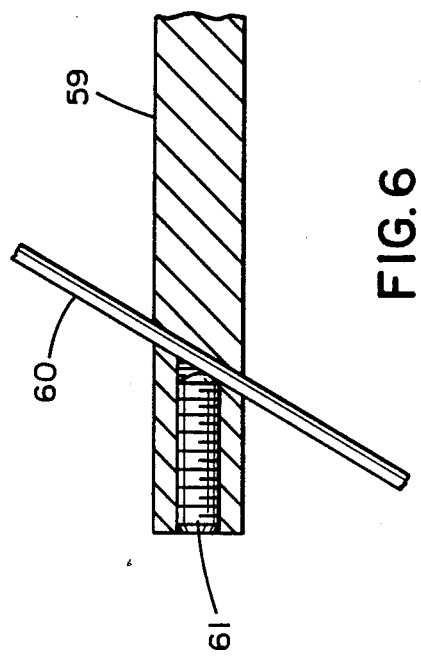

PROBE ASSEMBLY INCLUDING TOUCHDOWN SENSOR

This invention relates to apparatus for testing electronic circuitry and, more particularly, to a probe assembly including a probe point for contacting a target on the electronic component to be tested, and a touchdown sensor for indicating that contact has been established.

Background of the Invention

Test stations are commonly employed for determining the proper operation of electronic devices, particularly in the semiconductor area. The test stations include probe assemblies including probe points for engaging and establishing good electrical contact with predetermined target areas on the devices. Often the microelectronic component to be tested is relatively fragile and engagement by the probe point with excessive force could damage the component or the probe point.

Using the test station for determining the acceptability of a hybrid microcircuit exacerbates the problem because such devices, with their combination of chip active devices and thin or thick film passive devices, have inconsistent or gross topography. Thus good contact by the probe point cannot be equated to the lowering of the point to a predetermined level.

U.S. Pat. No. 3,488,461 to Webb is directed to a touch-actuated switch including an electrically conductive housing carrying a probe rod 12 insulated from the cylinder. When the end of the probe contacts an object, the rod bends within the housing causing an electrical contact button 18 to establish contact between the rod and the housing.

U.S. Pat. No. 2,011,931 to Dreyer shows a gauging apparatus including an indicating member 36 for making contact with one of a pair of adjustable screw contacts 39 and 40 which flank the end of member 36. The member 36 is carried by leaf springs 26 and 27 and is moved by means of plungers 14 and 15.

U.S. Pat. No. 3,243,186 to Johnson is directed to an indicator for detecting movement of the head of a golfer. Head movement causes a rod 4 to contact a metallic tube 5 at 26 causing a buzzer to sound.

U.S. Pat. No. 3,849,614 to Connery, U.S. Pat. No. 2,417,148 to Wright and U.S. Pat. No. 3,171,012 to Morehead show rods or leaf springs which distort upon a probe contacting an object resulting in the rod engaging a metal housing or other electrical contact.

Summary of the Invention

Among the various aspects and features of the present invention may be noted the provision of an improved probe assembly for use in a test station for contacting an electronic device. The probe assembly includes a sensor providing a switched output indicating that contact has been achieved. Additionally the probe assembly can be adjusted to vary the forcefulness of the engagement before switching action is completed so that good ohmic contact can be achieved without damage to either the electronic component to be tested or to the probe point. Furthermore the probe assembly of the present invention is reliable in use, has long service life, and is relatively easy and economical to manufacture. Other aspects and features of the invention will be, in part, apparent and, in part, pointed out specifically in the following specification and accompanying drawings.

Briefly, a probe assembly embodying various aspects of the present invention includes an elongated tubular housing having a first end and a second end and defining a cavity extending between the ends. A base of insulative material is rigidly supported in the housing adjacent the second end and a contact block is located in the housing adjacent the first end, with an interior beam assembly interconnecting the block and the base so that the block is supported by the base. The interior beam assembly includes a relatively flexible cantilever beam. The probe assembly further includes a relatively rigid second beam assembly extending from the contact block beyond the housing first end and holding a probe point for engaging the target. The probe assembly includes an upper contact held by the housing so that it extends into the cavity toward the contact block and in alignment with the contact block. A lower contact is provided held by the housing and extending into the cavity toward the contact block and in alignment therewith. The spacing between the contacts is greater than the height of the contact block with the facing surfaces of the contact block being conductive. The contact block engages the lower contact when the probe point does not engage the target, the block moves out of engagement with the lower contact after the probe point engages the target, and the block moves into contact with the upper contact when the force applied by the point against the target reaches a predetermined magnitude.

Brief Description of the Drawings

FIG. 3 is a perspective view of the probe assembly of FIG. 1 with a portion of a housing cut away to expose underlying components;

FIG. 4 is a cross sectional view taken generally along line 4—4 of FIG. 3 showing a contact block disposed inside the housing biased into engagement with a lower contact;

FIG. 5, similar to FIG. 4, illustrates the contact block moved out of engagement with the lower contact and into, engagement with an upper contact;

FIG. 6 is a sectional view taken generally along line 6—6 of FIG. 3 showing details of a probe holder and a probe point;

FIG. 7 is a side elevational view of the probe assembly with a portion of the housing cut away to show an electrical connector fixed to the housing and having terminal elements connected to various components of the probe assembly; and FIG. 8 is an electrical schematic diagram of the probe assembly illustrating a normally closed set of contacts, a normally open set of contacts, and a connection to the probe point.

Corresponding reference characters indicate corresponding parts throughout the several views of the drawings.

Description of the Preferred Embodiment

Figure 1:
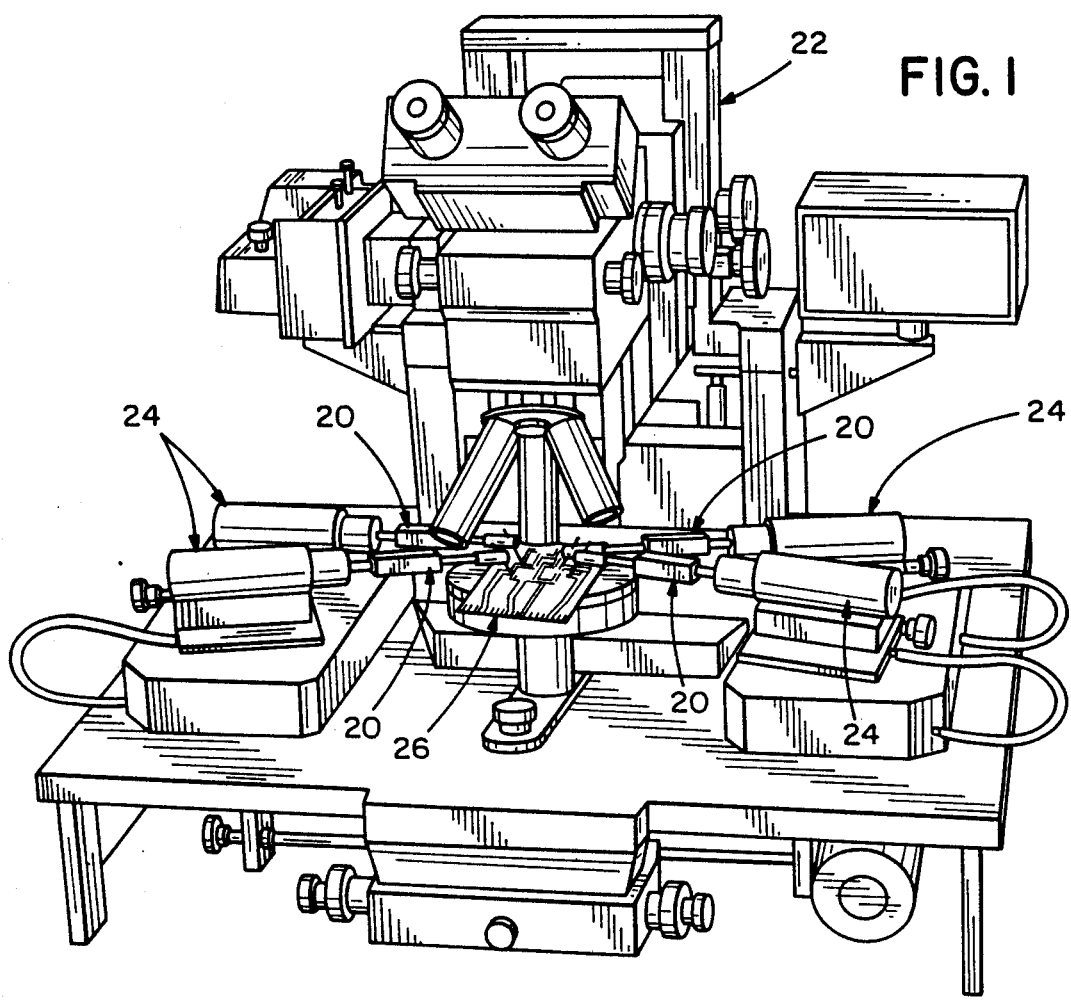
FIG. 1 is a perspective view of a test station for testing various electronic circuit components employing probe assemblies embodying various aspects of the present invention.
Figure 2:
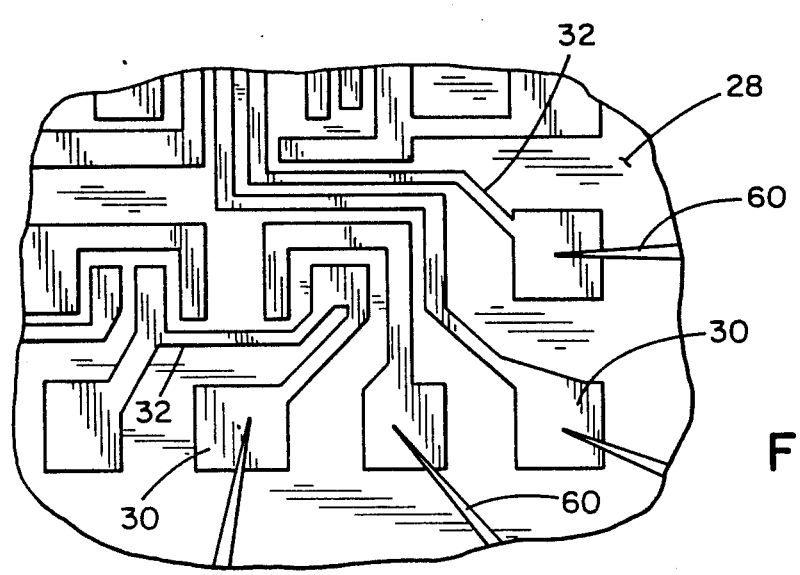
FIG. 2 is an enlarged plan view showing a portion of the top surface of a semiconductor device, certain target areas of which are to be contacted by the probe assemblies of FIG. 1.

Referring now to the drawings, a probe assembly for use at a test station 22 for contacting a predetermined target on an electrical circuitry component is generally indicated by reference numeral 20. As best shown in FIG. 1, the test station could include a number of manipulators 24 each of which holds and controls movement of a corresponding probe assembly 20. An example of such a test station is Model 7000 available from the Micromanipulator Company, Inc. of Carson City, Nev. FIG. 2 shows greatly enlarged a portion of an electrical circuitry component which could be tested using the station 22. The component 26 could include an integrated circuit chip having a top surface 28 including contact points 30 and conductive paths 32.

The probe assembly 20, best shown in FIGS. 3 and 7, includes an elongated tubular housing 34, preferably of rectangular cross section, including a first end 36, a second end 38, and defining a cavity 40 extending between the ends. A base 42 of relatively rigid insulative material, such as delrin, is held in the housing adjacent the second end 38. The probe assembly is connected to its corresponding manipulator 24 by a rigid shank 43 held in the base 42. A contact block 44 is located in the housing cavity adjacent the first end 36 with an interior beam assembly 46 interconnecting the base and the block so that the block is supported by the base. The contact block is also formed of a relatively rigid insulating material, preferably delrin, but with an electrically conductive coating on the top surface 48 and bottom surface 50 of the contact block.

The interior beam assembly 46 includes a short length of a rigid beam 52 extending from the base 42, a second short length of rigid beam 54 extending from the contact block 44 toward the base, and a somewhat stiff but relatively flexible cantilever beam 56 joining the rigid beams. This flexible beam is preferably formed of tungsten and its flexibility can be varied be changing its diameter. The probe assembly also includes a relatively rigid second beam assembly 58 extending from the contact block 44 beyond the housing first end 36. This beam assembly could include an extension of beam 54 connected to a probe holder 59. A probe point 60, for engaging the circuitry target, is held by the probe holder, as shown in FIG. 6.

The probe assembly 20 further includes an upper contact 62 held by the housing 34 in alignment with the contact block top surface 48 and extending into the cavity 40 toward the contact block. Similarly assembly 20 includes a lower contact 64 held by the housing in alignment with the contact block lower surface 50 and extending upwardly into the cavity toward the contact block. The upper contact includes a nut 66 affixed to the housing over an aperture in the housing and a set screw 68 threadably carried by the nut. The lower contact 64 is similar, comprising a nut 70 and a set screw 72 threadably carried by the nut 70. Mounted on the top wall of the housing over an opening in the top wall between the ends of the housing is a connector 74 including an insulative body 76 and four spaced terminal elements 78–84.

The first terminal element 78 is connected to the first rigid beam 52 of the interior beam assembly by a first thin wire 86. As the second rigid beam 54 of the interior beam assembly is integral with a component of the second beam assembly 58, and as the interior beam assembly and the second beam assembly are electrically conductive, the first terminal element 78 provides a connection to the probe point 60. The second terminal element 80 and the fourth terminal element 84 are connected to the conductive bottom surface 50 and to the conductive top surface 48 of the contact block 44 by thin conductors 88 and 90, respectively. Furthermore, the housing 34 is connected to the third terminal element 82 by a thin conductor 92. The third terminal element is electrically connected to the upper contact 62 and to the lower contact 64 because the housing, the nuts 66 and 70, and the set screws 68 and 72 are all electrically conductive or have electrically conductive coatings.

Referring to FIGS. 4 and 5, the rigid beam 54 is spaced from the conductive upper and lower surfaces 48 and 50 by insulative portions of the contact block 44. Additionally the height of the contact block is somewhat less than the spacing between the distal ends of the set screws 68 and 72. As shown in FIG. 4, when the probe point 60 does not engage the target of the circuitry component, the contact block rests lightly on the lower set screw 72. Thus as shown in the electrical schematic diagram of FIG. 8, terminal elements 80 and 82 are connected to a normally closed set of contacts. When the probe point 60 is lowered into engagement with the circuitry target, the contact block 44 is moved out of engagement with lower screw 72 causing the normally closed set of contacts 80, 82 to open. As indicated below, only a few milligrams of force will open the normally closed set of contacts. However, such a small force does not result in the contact block 44 moving into engagement with the upper set screw 68, because of the spring action of the flexible beam 56. The force required to move the contact block into engagement with the upper set screw is a function of the spring constant of the flexible beam and the vertical spacing between the upper and lower set screws. Thus the force required to be applied by the probe point against the target to effect closing of the normally open contacts 82, 84 can be increased by increasing the set screw spacing and/or increasing the spring constant of the flexible beam 56, for example, by increasing the beam diameter.

Thus, the probe assembly 20 not only includes a touchdown sensor for providing a switched output (opening of the normally closed contacts) indicating that contact with the target area has been established, but also includes a force control. That is, once the desired force which the probe point is to apply against the target is determined, the probe assembly can be adjusted to provide a second switched output (closing of the normally open contacts) to indicate that the force has been achieved. The use of the second switched output to stop application of additional force guards against damage to both the circuitry component and to the probe point. The predetermined force for contact closing can conveniently be adjusted by movement of the upper set screw to adjust the deflection distance of the contact block.

More specifically, the housing 34 functions as a rigid support for the beam assemblies and the set screws of the upper and lower switches. The housing is preferably rectangular in cross section and may have a width of 3/16 inch, a height of ⅜ inch, a length of two inches long and be formed of a thin wall brass tube. The shank 43 could be made of aluminum and be ⅛ inch in diameter and ⅜ inch long. The nuts 66 and 70 are preferably lock nuts, 2–56 nylon lock rim steel nuts. The nuts are glued over holes in the housing using conductive epoxy. The housing with the nuts in place is preferably gold plated for conductivity and lowered contact resistance. Both the upper and lower set screws 68 and 72 are round point 2-56 hex drive and are gold plated. The upper screw could be about ⅜ inch long and the lower screw about ¼ inch long.

The connector 74 or feed through header provides an anchor for the fine wires 86–92 that connect the internal parts of the probe assembly. These wires are preferably 36 gauge magnet wire, except that the wire 86 to the first terminal 78 is preferably 30 gauge plastic insulated to carry the signal to or from the probe point 60. The connector or header may be attached to outside equipment by a four wire flat ribbon cable, and also provides strain relief for the external cable.

The active element of the probe assembly 20 is the flexible cantilever beam 56 which could have a diameter of about 2/100 of an inch and a length of about ⅜ inch. The flexible beam 56 is preferably soldered to the ends of the first and second rigid beams 52 and 54. The flexible cantilever beam 56 is held in the insulating base 42 by the first rigid beam 52 which has a length of about ½ inch and is formed of about 1/16 inch diameter stainless steel tube. This beam 52 provides a non-moving attachment for the flexible beam and the signal wire 86 for electrical connection to the probe point. The flexible beam 56 is sufficiently stiff to hold the weight of the probe holder 59 so that the normally closed switch has very little weight on it. The flexible beam is also sufficiently flexible so that only a few milligrams of force will deflect the probe point to open the normally closed set of contacts. When the upper set screw 68 of the normally open switch is adjusted to move upwardly thereby increasing the gap, the maximum deflection force of the cantilever may be about 10 grams. The second rigid beam 54 extends from the flex beam 56 out to the second beam assembly 58 through the contact block 44. This beam is preferably of 1/16 inch diameter stainless steel tube and is about 1¼ inches long, including a portion of the second beam assembly.

The upper and lower surfaces 48 and 50 of the contact block may have a gold plated brass shim contact pad glued to them. The fine wires soldered to the contact pads extend in a gentle bend to the connector 74. The probe holder 59 is made of a 1/8 inch diameter stainless steel having a length of about 1¼ inches. The probe point 60 is held in a small opening drilled at about a 45 degree angle through the probe holder 59 and secured by a 2-56 set screw 61. The probe holder and exposed rigid beam may be gold plated for appearance and to facilitate electrical contact of the probe point in the probe holder.

Concerning setup and adjustment, with the probe assembly 20 installed in a manipulator 24, setscrew 61 is loosened and a probe point 60 inserted into the probe holder from the bottom side. The set screw is tightened only enough to keep the probe from sliding out.

Once the weight of the probe point is on the cantilever, the lower switch can be set using setscrew 72. With an indicator such as a continuity meter or low voltage light and battery connected to terminals 80 and 82, the setscrew 72 is brought up until contact is first made. The probe housing 34 must be horizontal and the setup location free of vibration. The closer the screw 72 is to the "just touching" position the more sensitive the probe will be to indicating when the point 60 actually touches the substrate and changes the loading on this switch (N.C.).

With an indicator light or continuity meter connected to terminals 82 and 84, the top switch (N.O.) can be set. Generally, for probe points of small radius, the gap can be set very close. Setscrew 68 is brought down until the indicator comes on then backed off, turned counterclockwise a few degrees. As small a gap as possible should be provided without the switch closing. This setup is then checked by viewing the probe point under the microscope, at an appropriate power for the point radius to judge that the overdrive or skate of the point is not excessive. The N.O. switch may be adjusted by trial and error until the desired force is applied on the point when the N.O. switch closes.

For a test station that uses a computer controlled Z axis, only one of the probe assemblies 20 is needed for touchdown sensing. If other probes are required, they can be regular passive probes (without the touch down sensor feature).

When probing in manual or automatic modes it may be necessary to overdrive the probe point 60 after initial contact to establish good electrical contact with the substrate. As indicated by inspection using a microscope, the probe point 60 moves vertically down until it makes contact. It then slides forward upon the substrate several point diameters. The amount of slide is a function of the amount of vertical overdrive. Factors contributing to the amount of overdrive needed are the continuity and resistivity of the contact, the point radius of the probe, and the geometry of the substrate.

With the contact probe it is possible to sense when the probe point makes contact with the substrate and, also, when a preset amount of overdrive is reached, without visual feedback from an operator. Its uses are as an adjunct to an operator to facilitate repetitive operations or as an input to an automated system with Z axis position control.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A probe assembly for use at a test station for contacting a predetermined target on an electrical circuitry component and providing a switched output to signal that contact with the target has been made, said probe assembly comprising:

an elongated tubular housing having a first end and a second end and defining a cavity extending between said ends;

a base of insulative material rigidly supported in said housing adjacent said second end;

a contact block located in said housing adjacent said first end;

an interior beam assembly interconnecting said block and said base so that said block is supported by said base, said interior beam assembly including a relatively flexible cantilever beam;

a relatively rigid second beam assembly extending from said contact block beyond said housing first end;

a probe point held by said second beam assembly for contacting said target;

an upper contact held by said housing and extending into said cavity toward said contact block and in alignment therewith; and a lower contact held by said housing and extending into said cavity toward said contact block and in alignment therewith, the spacing between said upper and lower contacts being greater than the height of said contact block and the surfaces of said contact block facing said contacts being conductive, said contact block engaging said lower contact when said probe point does not engage said target, said contact block moving out of engagement with said lower contact after said probe point engages said target, and said contact block moving into engagement with said upper contact upon the force applied by said point against said target reaching a predetermined magnitude.

2. A probe assembly as set forth in claim 1 wherein said flexible cantilever beam is made of tungsten.

3. A probe assembly as set forth in claim 1 wherein said interior beam assembly includes a length of a relatively rigid beam extending from said base, and a length of a relatively rigid beam extending from said contact block toward said base, said flexible cantilever beam joining said rigid beams.

4. A probe assembly as set forth in claim 1 further comprising a relatively rigid shank connecting said base to a component of said test station.

5. A probe assembly as set forth in claim 1 wherein said contact block is formed of insulative material except for said facing surfaces, said interior beam assembly and said second beam assembly being connected to each other inside said contact block and spaced from said facing surfaces, said probe point, said interior beam assembly and said second beam assembly being electrically conductive.

6. A probe assembly as set forth in claim 1 wherein said housing is electrically conductive and each of said upper and lower contacts is connected to said housing by a low resistance path.

7. A probe assembly as set forth in claim 6 further comprising a connector held by said housing and having a first terminal element connected to the surface of said contact block facing said upper contact, a second terminal element connected to the surface of said contact block facing said lower contact, and a third terminal element connected to said housing.

8. A probe assembly as set forth in claim 7 wherein said contact block is formed of insulative material except for said facing surfaces, said interior beam assembly and said second beam assembly being connected of each other inside said contact block and spaced from said facing surfaces, said probe point and said interior beam assembly and said second beam assembly being electrically conductive, said connector further having a fourth terminal element connected to said interior beam assembly adjacent said base.

9. A probe assembly as set forth in claim 1 wherein said upper contact comprises a nut fixed to said housing and a set screw threadably carried by said nut.

10. A probe assembly as set forth in claim 1 wherein said lower contact comprises a nut fixed to said housing and a set screw threadably carried by said nut.

* * * * *

UNITED STATES PATENT AND TRADEMARK OFFICE
CERTIFICATE OF CORRECTION

PATENT NO.   :   4,956,923
DATED        :   September 18, 1990
INVENTOR(S)  :   James T. Pettingell et al.

It is certified that error appears in the above-identified patent and that said Letters Patent is hereby corrected as shown below:

Column 5, line 39, change "1¼" to --1½--.
Column 5, line 46, change "1¼" to --1½--.

Signed and Sealed this

Seventeenth Day of March, 1992

Attest:

HARRY F. MANBECK, JR.

*Attesting Officer*          *Commissioner of Patents and Trademarks*